(12) United States Patent
Pillarisetty et al.

(10) Patent No.: US 11,393,526 B2
(45) Date of Patent: Jul. 19, 2022

(54) THIN FILM BASED 1T-1R CELL WITH RESISTIVE RANDOM ACCESS MEMORY BELOW A BITLINE

(71) Applicant: Intel Corporation, Santa Clara, CA (US)

(72) Inventors: Ravi Pillarisetty, Portland, OR (US); Elijah V. Karpov, Portland, OR (US); Abhishek A. Sharma, Hillsboro, OR (US); Prashant Majhi, San Jose, CA (US); Brian S. Doyle, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 857 days.

(21) Appl. No.: 16/011,512

(22) Filed: Jun. 18, 2018

(65) Prior Publication Data

US 2019/0385677 A1    Dec. 19, 2019

(51) Int. Cl.
| | | |
|---|---|---|
| *G11C 29/00* | (2006.01) | |
| *G11C 13/00* | (2006.01) | |
| *H01L 45/00* | (2006.01) | |
| *H01L 29/786* | (2006.01) | |
| *H01L 29/423* | (2006.01) | |
| *H01L 27/24* | (2006.01) | |

(52) U.S. Cl.
CPC ...... *G11C 13/0007* (2013.01); *H01L 27/2436* (2013.01); *H01L 29/42384* (2013.01); *H01L 29/7869* (2013.01); *H01L 29/78618* (2013.01); *H01L 45/1253* (2013.01); *H01L 45/145* (2013.01); *G11C 2213/34* (2013.01); *G11C 2213/79* (2013.01); *H01L 45/1206* (2013.01)

(58) Field of Classification Search
CPC ............ G11C 13/0007; H01L 45/1253; H01L 45/145; H01L 29/7869; H01L 29/42384; H01L 27/2436; H01L 29/78618
See application file for complete search history.

(56) References Cited

U.S. PATENT DOCUMENTS

2017/0236581 A1*   8/2017   Yang ................... G11C 11/1653
                                                                 365/148

FOREIGN PATENT DOCUMENTS

WO    WO-2018063207 A1 *   4/2018   ......... G11C 13/0097

* cited by examiner

*Primary Examiner* — Mohammed A Bashar
(74) *Attorney, Agent, or Firm* — Essential Patents Group, LLP

(57) ABSTRACT

Described is a memory cell which comprises: a transistor positioned in a backend of a die, the transistor comprising: a source structure and a drain structure; a gate structure between the source structure and the drain structure; a source contact coupled to and above the source structure and a drain contact coupled to and below the drain structure; and a Resistive Random Access Memory (RRAM) device coupled to the drain contact.

22 Claims, 9 Drawing Sheets

THIN FILM BASED 1T-1R CELL WITH RESISTIVE RANDOM ACCESS MEMORY BELOW A BITLINE

BACKGROUND

For the past several decades, the scaling of features in integrated circuits (ICs) has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased functionality. The drive for ever-more functionality, however, is not without issue. It has become increasingly significant to rely heavily on innovative fabrication techniques to meet the exceedingly tight tolerance requirements imposed by scaling.

Non-volatile on-chip embedded memory with resistive random access memory (RRAM) devices can improve energy and computational efficiency of a system on chip (SOC). Approaches to integrating resistive random access memory (RRAM) device with a transistor to create embedded memory presents challenges that have become far more formidable with scaling. As transistor operating voltages are scaled down in an effort to become more energy efficient, RRAM memory devices that are connected in series with such transistors are also required to function at lower voltages and currents.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
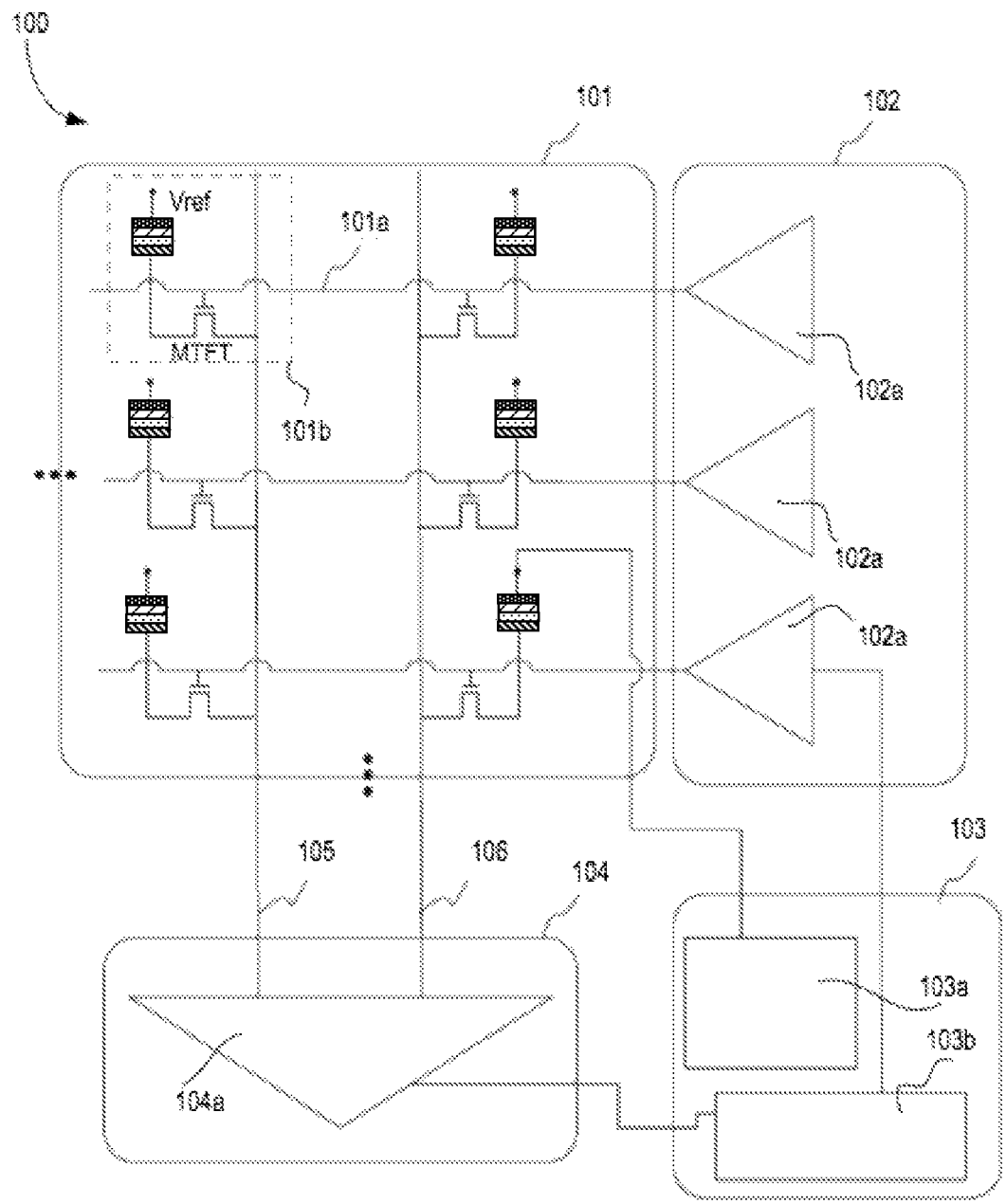
FIG. 1 illustrates a schematic of a multilayer memory device structure, in accordance with some embodiments.

In some embodiments of a resistive random-access memory (RRAM) device, a transistor of a memory cell is fabricated on and/or within a semiconductor during back-end-of-line (BEOL) or backend processing. Non-volatile memory devices such as an RRAM device depend on a phenomenon of resistance switching to store information. The non-volatile memory device functions as a variable resistor where the resistance of the device may switch between a high resistance state and a low resistance state.

Resistance switching relies on a change in conductivity of the RRAM device. The RRAM "Reset" occurs with a negative voltage (e.g. −V) applied to the device, and "Set" occurs with a positive voltage (e.g. +V) applied to the device. For a one-bit memory cell, "Set" typically means the output is set to "1", and "Reset" means the output is set to "0". Furthermore, typical RRAM devices are asymmetric, and more voltage is typically needed for "Reset" than for "Set". However, in the current state of the art of 1T-1R (one transistor, one resistor) RRAM cells, the opposite takes place, which causes weakening of the transistor due to source degeneration during RESET.

Embodiments of the current invention allow for source degeneration to occur during RRAM "set". This eliminates source degeneration when switching one polarity of the RRAM cell. It allows for the transistor coupled to the RRAM to have full strength in both polarities, allowing for max voltage/current to be applied to the RRAM to ensure a higher percentage of bits flip, which can enable better array level yield. Additionally, it allows a larger RRAM dot without increase in cell size. Other technical effects will be evident from the various embodiments and figures.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The term "adjacent" here generally refers to a position of a thing being next to (e.g., immediately next to or close to with one or more things between them) or adjoining another thing (e.g., abutting it).

The meaning of "a," "an," and "the" include plural references. The meaning of "in" includes "in" and "on."

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials or materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, the term "backend" or backend of line (BEOL) generally refers to a section of a die which is opposite of a "frontend" and where an IC (integrated circuit) package couples to IC die bumps. For example, high level metal layers (e.g., metal layer 6 and above in a ten metal stack die) and corresponding vias that are closer to a die package are considered part of the backend of the die. The BEOL is the portion of IC fabrication where individual semiconductor devices (whether embedded memory or logic transistors) are interconnected to one another with electrically conductive features such as metal interconnect traces (lines) within a given metallization level and metal-filled conductive vias between multiple metallization levels. These conductive interconnects are embedded in a dielectric material so that the memory device is a monolithic integrated circuit. Conversely, the term "frontend" or frontend of line (FEOL) generally refers to a section of the die that includes the traditional active region (e.g., where transistors (e.g., BJT, MOS) are fabricated) and low level metal layers and corresponding vias that are closer to the active region (e.g., metal layer 5 (M5) and below in a ten metal stack die example).

It is pointed out that those elements of a figure having the same reference numbers (or names) as the elements of any other figure can operate or function in any manner similar to that described, but are not limited to such.

FIG. 1 illustrates schematic 100 of a multilayer memory device structure, according to some embodiments of the disclosure. Memory devices comprising one or more arrays in which individual memory cells include a thin film transistor (TFT) and a RRAM (1T-1R) are described herein. For some exemplary embodiments, the transistor of a 1T-1R storage cell is a TFT rather than a silicon-based transistor (e.g., MOSFET). Thin-film transistors (TFTs) are a class of field-effect transistors (FETs) in which the channel material is a deposited thin film rather than a monocrystalline material. A common application of TFT technology is liquid crystal displays (LCDs), but TFTs are also advantageous in other applications as the thin film deposition processes employed in TFT fabrication can be relatively low (e.g., below 450° C.), allowing TFTs to be inserted within layers of interconnect metallization of the type that is typically formed only after higher-temperature processing is completed in conventional silicon MOSFET fabrication technology. TFTs can be fabricated using a wide variety of semiconductor materials, such as silicon, germanium, silicon-germanium, as well as various oxide semiconductors (also known as semiconducting oxides) including metal oxides such as indium gallium zinc oxide (IGZO), indium zinc oxide (IZO), and the like.

In this high level view, the memory schematic or system 100 comprises memory array 101, row circuitry 102, control circuitry 103, and column circuitry 104. In some embodiments, memory array 101 is a two-dimensional (2D) array of 1T-1R memory cells 101b. Each memory cell 101b includes an RRAM, and a TFT transistor MTFT (also referred to as the select transistor). In some embodiments, the memory cells 101b are networked with conductive traces including word-lines (WL) 101a and bit-lines (BL) 105 and 106 (reference). In some embodiments, TFT transistor MTFT electrically couples to the RRAM forming the 1T-1R memory cell.

In some embodiments, memory array 101 is fabricated in the BEOL interconnect levels of an integrated circuit (IC) chip. In some embodiments, all of RRAMs, bitlines (BLs) 105, 106, wordline (WL) 101a, and transistors MTFTs are fabricated within, and/or between, various interconnect metallization levels. In some embodiments, peripheral memory circuitry including at least one of row circuitry 102 and column circuitry 104, is fabricated in a device level that falls within at least some of the footprint of memory system 100.

For example, BLs 105, 106 may be electrically coupled to a sense amplifier 104a employing MOSFETs fabricated in a region of a monocrystalline semiconductor device layer (e.g., silicon substrate) that is at least partially underlying memory system 100. In some embodiments, WLs 101a are electrically coupled to WL drivers 102/102a that employ MOSFETs fabricated in a region of a monocrystalline semiconductor device layer (e.g., silicon substrate) that is at least partially underlying memory array 101.

In some embodiments, peripheral memory circuitry further includes control circuitry 103. One or more of memory array 101, row circuitry 102, and/or column circuitry 104 may be electrically coupled to control circuitry 103. In some embodiments, control circuitry 103 may also be fabricated in the device level that falls within the footprint of memory array 101. In some embodiments, control circuitry 103 may, for example, also employ MOSFETs fabricated in a region of a monocrystalline semiconductor device layer (e.g., silicon substrate) that is at least partially underlying memory array 101.

In some embodiments, control circuitry 103 may include, for example, various voltage biasing circuits, such as capacitor bias circuitry 103a. Control circuitry 103 may include, for example, various memory management circuitry, such as control logic 103b communicatively coupled into row circuitry 102 and column circuitry 104 so as to permit coordinated operation of sense amplifier 104a and WL driver 102.

A memory device architecture 100 employing TFTs in the memory array 101 enables vertical integration of the peripheral circuitry, in accordance with various embodiments.

Figure 2:
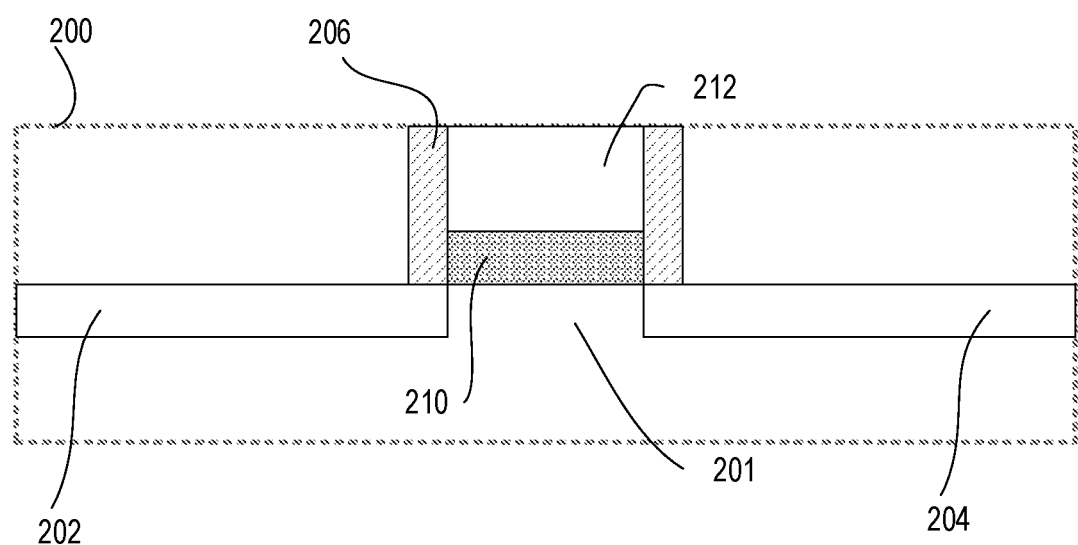
FIG. 2 illustrates a cross-sectional view of Thin Film Transistor (TFT), in accordance with an embodiment.

FIG. 2 illustrates a cross-sectional view of TFT transistor 200, in accordance with some embodiments of the present disclosure. In some embodiments, the TFT transistor 200, corresponds to the MTFT transistor in a multilayer memory device architecture 100.

In some embodiments, the underlying substrate 201 represents a surface used to manufacture integrated circuits. In some embodiments, substrate 201 is a passivation material. In some embodiments, passivation material is an Interlayer Dielectric (ILD). For example, porous SiO2, fluorine-doped SiO2, carbon-doped SiO2, porous-doped SiO2, spin-on silicon based polymeric dielectric, or spin-on organic polymeric dielectric, can be used as ILD. In some embodiments, the ILD material includes one or more of: Si, O, C, F, Hf, Zr, Al, N, Ta, Ti, Y, or La. In some embodiments, the thickness of the ILD (shown as Ti in FIG. 2) is less than or equal to 60 nanometers (nm). ILD are dielectric materials used to electrically separate closely spaced interconnect lines arranged in several levels (multilevel metallization) in an advanced integrated circuit. Typically, ILD features low dielectric constant K (e.g., as close to 1 as possible) to minimize capacitive coupling ("cross talk") between adjacent metal lines.

In some embodiments, the TFT transistor 200 associated with substrate 201 are a thin film transistors (TFTs), fabricated on the substrate 201. In some embodiments, the TFT transistor 200 of substrate 201 includes a gate stack formed of at least two layers, a gate dielectric layer 210 and a gate electrode layer 212. The gate dielectric layer 210 may include one layer or a stack of layers. The one or more layers may include silicon oxide, silicon dioxide ($SiO_2$) and/or a high-K dielectric material. In some embodiments, the high-K dielectric material includes one or more of: $HfO_2$, $Al_2O_3$, $Ta_2O_5$, $TiO_2$, SiN, SiON, $SiO_2$, SiAl $O_x$, $HfSiO_x$, $HfAlO_x$, AlN, $ZrO_x$, $HfZrO_x$, $ZrAlO_x$, $SiAlO_x$, $Y_2O_3$, $La_2O_3$, $HfYO_x$, $HfLaO_x$, SiOC, SiAlC, SiC, SiAlN, $HfTiO_x$, or $AlTiO_x$. In other embodiments, the high-K dielectric material includes one or more of: Hf, Si, O, Zr, Al, N, Ta, Ti, Y, La, or C. In some embodiments, an annealing process may be carried out on the gate dielectric layer 210 to improve its quality when a high-k material is used.

The gate electrode layer 212 of transistor 200 is formed on the gate dielectric layer 210 and comprises of an N-type work function metal, as the transistor is to be an n-type transistor. In some implementations, the gate electrode layer 212 may comprise of a stack of two or more metal layers, where one or more metal layers are work function metal layers and at least one metal layer is a conductive fill layer.

In some embodiments, gate electrode 212 is formed adjacent to the gate dielectric 210. In some embodiments, the gate electrode 212 includes one or more of: Pt, Ir, Ru, Mo, TaN, ITO, IZO, AZO, TiN, W, TiAlC, TaAlC, Al, WC, Cu, Ta, or Au. In some embodiments, the gate electrode 212 includes one or more of: Ti, N, Ta, W, C, Pt, Cr, Hf, Ir, Ru, Mo, In, O, Al, Zn, Cu, or Au. Each of these metals or metallic compounds may be associated with a particular work function (or metal-semiconductor work function difference) that has an impact transistor threshold voltage. Although gate electrode 212 is illustrated as homogeneous, a stack or laminate of metals may also be employed.

In some implementations, the gate electrode layer 212 may comprise of a U-shaped structure that includes a bottom portion substantially parallel to the surface of the substrate and two sidewall portions that are substantially perpendicular to the top surface of the substrate. In another implementation, at least one of the metal layers that form the gate electrode layer 212 may simply be a planar layer that is substantially parallel to the top surface of the substrate and does not include sidewall portions substantially perpendicular to the top surface of the substrate. In further implementations of the disclosure, the gate electrode layer 212 may comprise of a combination of U-shaped structures and planar, non-U-shaped structures. For example, the gate electrode layer 212 may comprise of one or more U-shaped metal layers formed atop one or more planar, non-U-shaped layers.

In some implementations of the disclosure, a pair of sidewall spacers 206 may be formed on opposing sides of the gate stack that bracket the gate stack. The sidewall spacers 206 may be formed from a material such as silicon nitride, silicon oxide, silicon carbide, silicon nitride doped with carbon, or silicon oxynitride. Processes for forming sidewall spacers are well-known in the art and generally include deposition and etching process operations. In an alternate implementation, a plurality of spacer pairs may be used, for instance, two pairs, three pairs, or four pairs of sidewall spacers may be formed on opposing sides of the gate stack. In some embodiments, the spacers 206 include one or more of: $HfO_2$, $Al_2O_3$, $Ta_2O_5$, $TiO_2$, SiN, SiON, $SiO_2$, SiAl $O_x$, $HfSiO_x$, $HfAlO_x$, AlN, $ZrO_x$, $HfZrO_x$, $ZrAlO_x$, $SiAlO_x$, $Y_2O_3$, $La_2O_3$, $HfYO_x$, $HfLaO_x$, SiOC, SiAlC, SiC, SiAlN, $HfTiO_x$, or $AlTiO_x$. In some embodiments, the spacers 206 include one or more of: Hf, Si, O, Zr, Al, N, Ta, Ti, Y, La, or C.

As is well-known in the art, source region 202 and drain region 204 are formed within the substrate 201 adjacent to the gate stack of each TFT transistor. The source region 202 and drain region 204 are generally formed using either an implantation/diffusion process or an etching/deposition process. In the former process, dopants such as boron, aluminum, antimony, phosphorous, or arsenic may be ion-implanted into the substrate to form the source region 202 and drain region 204. An annealing process that activates the dopants and causes them to diffuse further into the substrate typically follows the ion implantation process. In a latter process, substrate 201 may first be etched to form recesses at the locations of the source and drain regions. An epitaxial deposition process may then be carried out to fill the recesses with material that is used to fabricate the source region 202 and drain region 204.

In some implementations, the source region 202 and drain region 204 may be fabricated using a silicon alloy such as silicon germanium or silicon carbide. In some implementations the epitaxially deposited silicon alloy may be doped insitu with dopants such as boron, arsenic, or phosphorous. In further embodiments, the source region 202 and drain region 204 may be formed using one or more alternate semiconductor materials such as germanium or a suitable group III-V compound. And in further embodiments, one or more layers of metal and/or metal alloys may be used to form the source region 202 and drain region 204.

Figure 3:
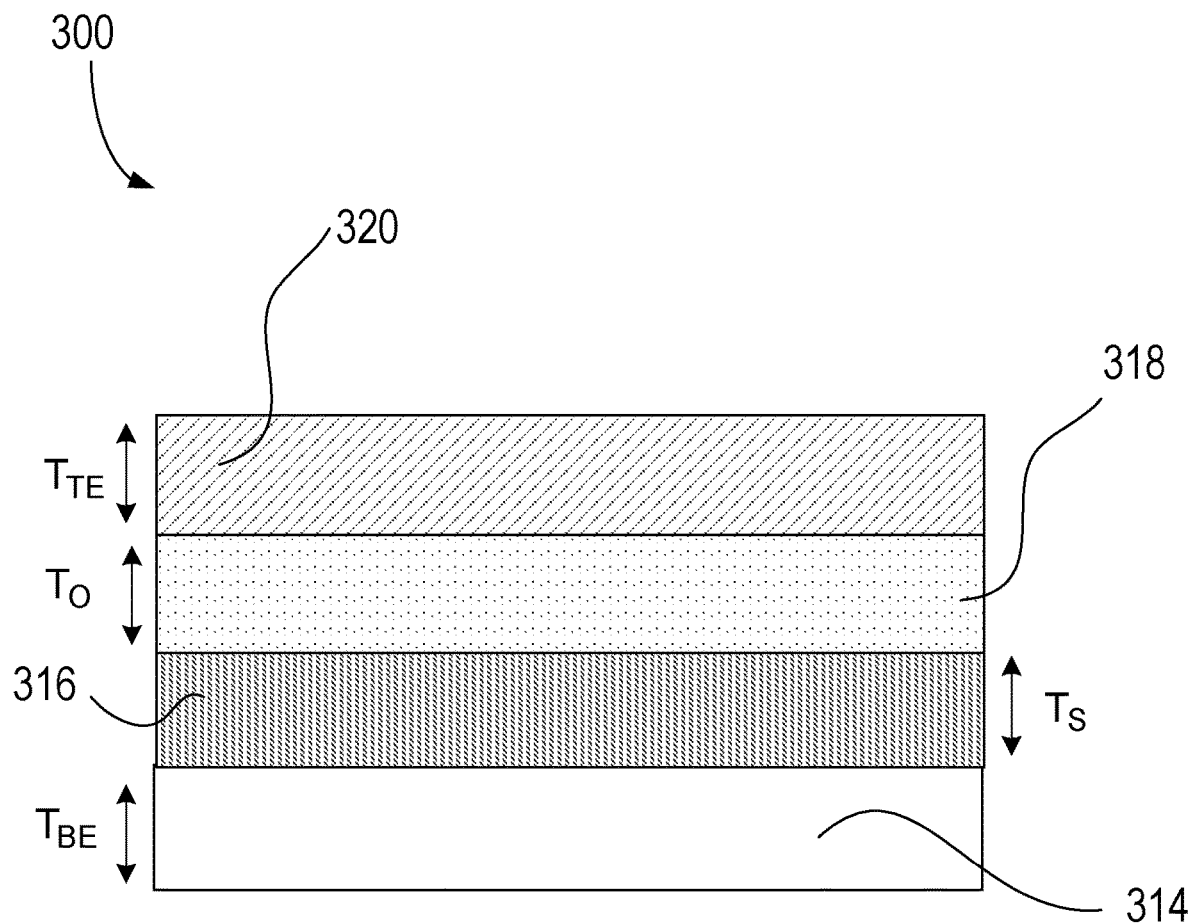
FIG. 3 illustrates a cross-sectional view of an example non-volatile memory (NVM) element that includes a resistive random-access memory (RRAM) device, in accordance with some embodiments.

FIG. 3 illustrates a cross-sectional view of an example non-volatile memory element 300 that includes a resistive random-access memory (RRAM) device, in accordance with some embodiments. In some embodiments, the RRAM device corresponds to the RRAM in multilayer memory device structure 100 of FIG. 1. In the illustrated embodiment, the RRAM material stack includes a bottom electrode 314, a switching layer 316 over the bottom electrode 314, an oxygen exchange layer 318 over the switching layer 316, and a top electrode 320 on the oxygen exchange layer 318.

In some embodiments, bottom electrode 314 includes an amorphous conductive layer. In some embodiments, bottom electrode 314 is a topographically smooth electrode. In some embodiments, bottom electrode 314 includes a material such as W, Ta, TaN or TiN. In some embodiments, bottom electrode 314 is composed of Ru layers interleaved with Ta layers. In some embodiments, bottom electrode 314 has a thickness ($T_{BE}$ in FIG. 3) in a range of 20 nm (nanometers) to 50 nm. In some embodiments, top electrode 320 includes a material such as W, Ta, TaN or TiN. In some embodiments, top electrode 320 has a thickness ($T_{TE}$ in FIG. 3) in a range of 30 nm to 70 nm. In some embodiments, bottom electrode 314 and top electrode 320 are the same metal such as Ta or TiN.

In some embodiments, switching layer 316 may be a metal oxide, for example, including oxygen and atoms of one or more metals, such as, but not limited to Hf, Zr, Ti, Ta or W. In the case of titanium or hafnium, or tantalum with an oxidation state +4, switching layer 316 has a chemical composition, $MO_X$, where O is oxygen and X is or is substantially close to 2. In the case of tantalum with an oxidation state +5, switching layer 316 has a chemical composition, $M_2O_X$, where O is oxygen and X is or is substantially close to 5. In some embodiments, switching layer 316 has a thickness ($T_S$ in FIG. 3) in a range of 1 nm to 5 nm.

Oxygen exchange layer 318 acts as a source of oxygen vacancy or as a sink for $O_2$. In some embodiments, oxygen exchange layer 318 comprises a metal such as but not limited to, hafnium, tantalum or titanium. In some embodiments, oxygen exchange layer 318 has a thickness ($T_O$ in FIG. 3) in a range of 5 nm to 20 nm. In some embodiments, the thickness of oxygen exchange layer 318 is at least twice the thickness of switching layer 316. In some other embodiments, the thickness of oxygen exchange layer 318 is at least twice the thickness of switching layer 316. In some embodiments, the RRAM device has a combined total thickness of the individual layers in a range of 60 nm to 100 nm and width in a range of 10 nm to 50 nm.

Figure 4A:
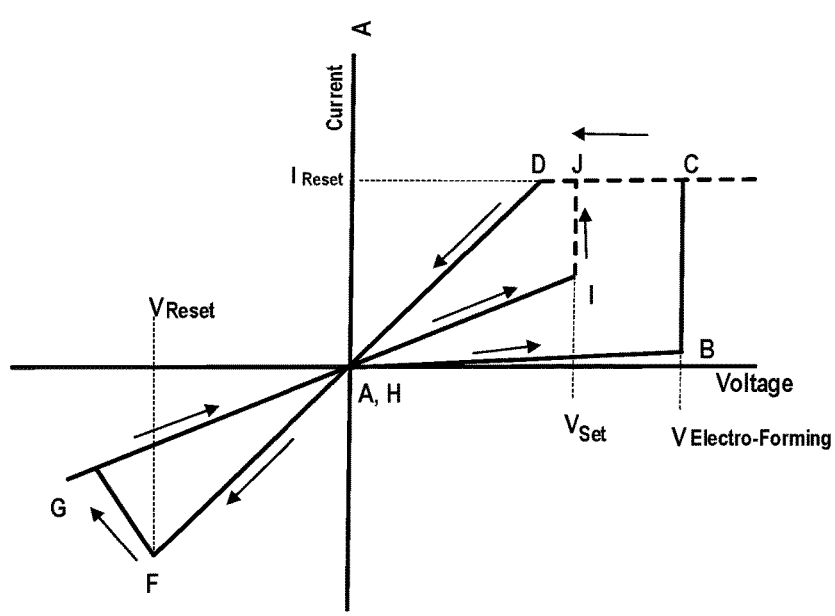
FIG. 4A illustrates an I-V (current-voltage) plot, demonstrating concepts involved with filament formation and voltage cycling (reading and writing) in an RRAM device, in accordance with some embodiments.
Figure 4B:
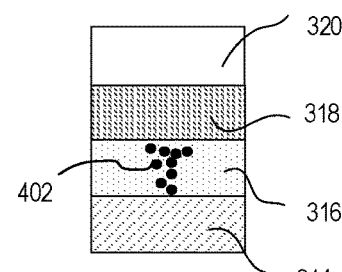
FIG. 4B depicts an illustration of a filament in an RRAM device, in accordance with some embodiments.

FIG. 4A illustrates an I-V plot, demonstrating concepts involved with filament formation and voltage cycling (reading and writing) in an RRAM device, such as an RRAM device 400 depicted in FIG. 4B, in accordance with embodiments of the present invention. RRAM device 400 is the same or substantially the same as the RRAM device 300. The initial operation of the RRAM device 400 begins by applying a voltage, between the top electrode 320 and the bottom electrode 314, that increases in magnitude until it reaches a value VElectro-Forming (point A to B). In some embodiments, VElectro-Forming is less than 1.6V. In an intentional one-time breakdown process, known as electroforming, oxygen vacancies, Vo, are removed from the oxygen exchange layer 318 into the switching layer 316 to augment the vacancies created during the anneal process described above. Movement of vacancies in response to an electric field generated in the RRAM device 400 leads to a formation of a "conductive filament" in the switching layer 316.

FIG. 4B depicts an illustration of a filament 402 in the RRAM device 400, in accordance with an embodiment of the present disclosure. It is to be appreciated that a size of the filament 402 may be determined by resistance of the RRAM device before the process of electro-forming and by the electroforming voltage. With a conductive filament, bridging from the top electrode 314 to the bottom electrode 320, the RRAM device 400 is said to be almost immediately conductive. Referring again to the I-V plot, RRAM device 400 becomes conductive and the current through the RRAM device starts to increase (point B to C), until it reaches a predetermined compliance current, IComp. The current through the RRAM device 400 does not continue to increase beyond IComp. In an embodiment, when the RRAM device is coupled with a transistor, IComp may be the maximum current that the transistor can deliver to the RRAM device 400. At point C, the RRAM device 400 is in a low resistance state.

Figure 4C:
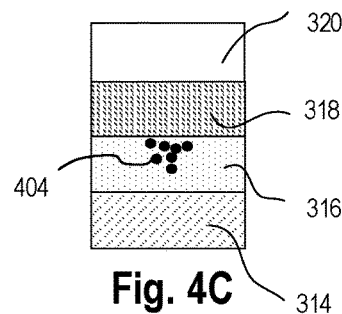
FIG. 4C depicts an illustration of a dissolved filament in the RRAM device, in accordance with some embodiments.

By reducing the magnitude of the voltage (while maintaining a positive polarity) between the top electrode 314 and bottom electrode 320 (moving from point C to D and then to point A), causes a reduction in a strength of the electric field. By applying a voltage of an opposite polarity between the top electrode 314 and bottom electrode 320 (moving from point A to F), causes a reversal in a direction of the electric field. In response to the change in the direction of the electric field, the oxygen vacancies move towards the oxygen exchange layer 318, leading to a dissolution of the conductive filament in the switching layer 316. Filament dissolution takes place at a critical voltage (point F), termed VReset. In some embodiments, VReset is between −0.8 V and −1.0 V. Increasing the magnitude of the voltage beyond VReset changes the current flowing through the device. With a dissolved filament, the current through the RRAM device 400 decreases dramatically and the device returns to a high resistance state (point G). FIG. 4C depicts an illustration of a dissolved filament 404 in the RRAM device 400, in accordance with an embodiment of the present disclosure.

Referring again to the I-V plot in FIG. 4A, it is to be appreciated that the high resistance level of the RRAM device, point G, is different and lower in magnitude compared to the resistance level of the device before the onset of the forming process. For example, the resistance level of the RRAM device 400 in a high resistance state can be over 10 times smaller than the virgin resistance (discussed above). By decreasing the magnitude of the voltage, traversing from point G to H and then to point I in the I-V plot, the dissolved filament is recreated again (at point I) under the action of vacancy migration. At a critical voltage, VSet, the filament completely bridges the top electrode 314 and the bottom electrode 320 and current begins to flow through the RRAM device. In an embodiment, VSet is less than 1.0 V. The RRAM device is, once again, said to be in a conductive or a low resistance state (at point J). The filament that is recreated at point J may have a size that is comparable to the size of the filament formed during the electro-forming process.

The cycling of an RRAM device 400 in this manner, where the resistance levels remain unchanged when the voltage between the top electrode 314 and the bottom electrode 320 is set to 0V, leads to realization of non-volatile memory. By increasing the magnitude of the voltage to at least 0.05V, the resistance state of the RRAM device 400 can be read. In one example, a voltage of 0.05V to 0.2V, referred to as a read voltage, VR, is much less than the switching voltage (VSet or VReset) and does not perturb the resistance state of the RRAM device 400. It is to be appreciated that the values VSet and VReset, generally refer to a portion of a voltage that may be applied to a transistor in series with the RRAM device 400. The RRAM device 400 coupled with a transistor in this manner is given the term embedded memory.

Figure 5:
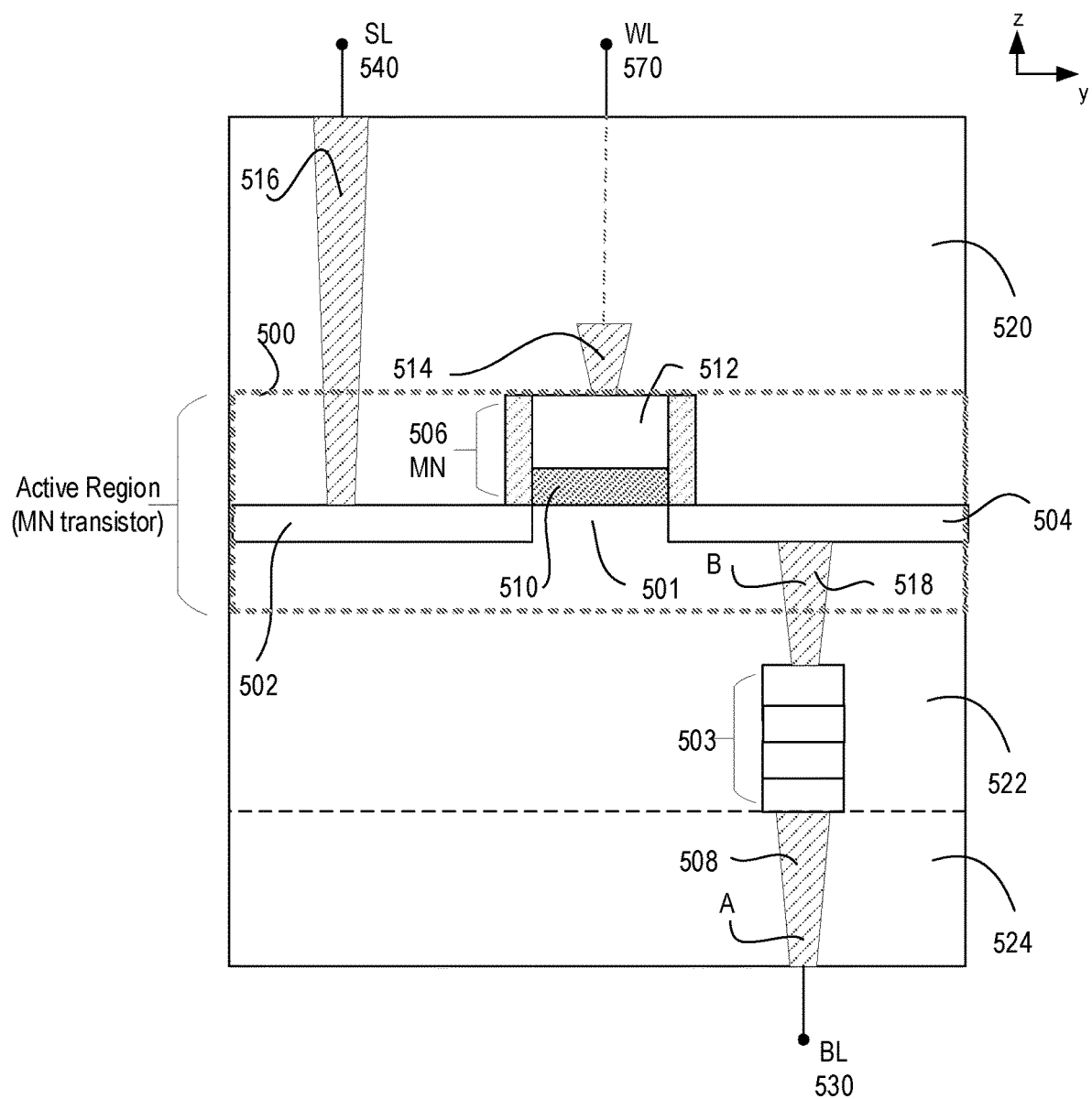
FIG. 5 illustrates a cross-sectional view of a memory device (e.g., comprising any one of devices of FIGS. 2-4) coupled to a transistor and a bit line, in accordance with some embodiments.

FIG. 5 illustrates a cross-sectional view of a memory device (e.g., comprising any one of devices of FIGS. 3-4) coupled to a transistor and a bit line, according to some embodiments. In some embodiments, the transistor 500 is disposed on a substrate 501.

In some embodiments, transistor 500 has a source region 502, a drain region 504 and a gate 506. The transistor 500 (e.g., n-type transistor MN) further includes a gate contact 514 disposed above and electrically coupled to the gate 506, a source contact 516 disposed above and electrically coupled to the source region 502, and a drain contact 518 disposed below and electrically coupled to the drain region 504. In various embodiments, RRAM memory device (e.g., any of devices of FIGS. 3-4) is disposed below the transistor 500 such that terminal A is coupled to via or metal structure 508, and terminal B is coupled to via metal structure 508.

In some embodiments, the RRAM memory device 503 includes individual functional layers that are described in association with FIGS. 3-4. In some embodiments, a word-line (WL) contact 570 is disposed onto the gate contact 514 on a second y-z plane behind (into the page) the first y-z plane metal 514.

In some embodiments, transistor 500 associated with substrate 501 is a Thin Film Transistor (TFT), fabricated on the substrate 501. In various embodiments of the present disclosure, the TFT device 500 includes individual functional layers that are described in association with FIG. 2.

In some embodiments, a voltage $V_{DS}$ is applied between the bit-line (BL) 530 and the source-line (SL) 540 and a word-line 570 is energized above a threshold voltage, $V_{TH}$ on the transistor 500. In some embodiments, by applying a voltage $V_{DS}$ between bit-line 530 and source-line 540, current can flow through the RRAM memory device 503. With RRAM below the transistor the RESET direction does not see source degeneration. The RRAM stack now sees source degeneration in the preferred SET direction.

In some embodiments, the underlying substrate 501 represents a surface used to manufacture integrated circuits. In some embodiments, the substrate 501 includes a suitable semiconductor material such as but not limited to, single crystal silicon, polycrystalline silicon and silicon on insulator (SOI). In some embodiments, substrate 501 (corresponding to substrate 201 in FIG. 2) is a passivation material. In some embodiments, passivation material is an Interlayer Dielectric (ILD). For example, porous $SiO_2$, fluorine-doped $SiO_2$, carbon-doped $SiO_2$, porous-doped $SiO_2$, spin-on silicon based polymeric dielectric, or spin-on organic polymeric dielectric, can be used as ILD. In some embodiments, the ILD material includes one or more of: Si, O, C, F, Hf, Zr, Al, N, Ta, Ti, Y, or La. In some embodiments, the thickness of the ILD (shown as Ti in FIG. 2) is less than or equal to 60 nm. ILD are dielectric materials used to electrically separate closely spaced interconnect lines arranged in several levels (multilevel metallization) in an advanced integrated circuit. Typically, ILD features low dielectric constant K (e.g., as close to 1 as possible) to minimize capacitive coupling ("cross talk") between adjacent metal lines.

The substrate 501 may also include semiconductor materials, metals, dopants, and other materials commonly found in semiconductor substrates.

In some embodiments, the transistor 500 includes a gate stack formed of at least two layers, a gate dielectric layer 510 and a gate electrode layer 512 (corresponding to gate dielectric layer 210 and gate electrode layer 212 in FIG. 2). The gate dielectric layer 510 may include one layer or a stack of layers. The one or more layers may include silicon oxide, silicon dioxide ($SiO_2$) and/or a high-k dielectric material. In some embodiments, the high-K dielectric material includes one or more of: $HfO_2$, $Al_2O_3$, $Ta_2O_5$, $TiO_2$, SiN, SiON, $SiO_2$, $SiAlO_x$, $HfSiO_x$, $HfAlO_x$, AlN, $ZrO_x$, $HfZrO_x$, $ZrAlO_x$, $SiAlO_x$, $Y_2O_3$, $La_2O_3$, $HfYO_x$, $HfLaO_x$, SiOC, SiAlC, SiC, SiAlN, $HfTiO_x$, or $AlTiO_x$. In other embodiments the high-K dielectric material includes one or more of: Hf, Si, O, Zr, Al, N, Ta, Ti, Y, La, or C. In some embodiments, an annealing process may be carried out on the gate dielectric layer 510 to improve its quality when a high-k material is used.

The gate electrode layer 512 of the transistor 500 is formed on the gate dielectric layer 510 and may comprise of one N-type work-function metal, when the transistor is to be an NMOS transistor. In some embodiments, the gate electrode layer 512 may comprise of a stack of two or more metal layers, where one or more metal layers are work-function metal layers and at least one metal layer is a conductive fill layer.

In some embodiments, the gate electrode 512 is formed adjacent to the gate dialectic 507. In some embodiments, the gate electrode 512 includes one or more of: Pt, Ir, Ru, Mo, TaN, ITO, IZO, AZO, TiN, W, TiAlC, TaAlC, Al, WC, Cu, Ta, or Au. In some embodiments, the gate electrode 212 includes one or more of: Ti, N, Ta, W, C, Pt, Cr, Hf, Ir, Ru, Mo, In, O, Al, Zn, Cu, or Au. Each of these metals or metallic compounds may be associated with a particular work function (or metal-semiconductor work function difference) that has an impact transistor threshold voltage. Although gate electrode 212 is illustrated as homogeneous, a stack or laminate of metals may also be employed.

In some embodiments, the gate electrode layer 512 may comprise a U-shaped structure that includes a bottom portion substantially parallel to the surface of the substrate and two sidewall portions that are substantially perpendicular to the top surface of the substrate. In another embodiment, at least one of the metal layers that form the gate electrode layer 512 may simply be a planar layer that is substantially parallel to the top surface of the substrate and does not include sidewall portions substantially perpendicular to the top surface of the substrate. In some embodiments of the present disclosure, the gate electrode layer 512 may comprise of a combination of U-shaped structures and planar, non-U-shaped structures. For example, the gate electrode layer 512 may comprise of one or more U-shaped metal layers formed atop one or more planar, non-U-shaped layers.

In some embodiments, a pair of gate dielectric layer 510 may be formed on opposing sides of the gate stack that bracket the gate stack. The gate dielectric layer 510 may be formed from a material such as silicon nitride, silicon oxide, silicon carbide, silicon nitride doped with carbon, or silicon oxynitride. Processes for forming sidewall spacers are well known in the art and generally include deposition and etching process operations. In some embodiments, a plurality of spacer pairs may be used, for instance, two pairs, three pairs, or four pairs of sidewall spacers may be formed on opposing sides of the gate stack.

In some embodiments, source region 502 and drain region 504 are formed within the substrate adjacent to the gate stack of the transistor 500. The source region 502 and drain region 504 are generally formed using either an implantation/diffusion process or an etching/deposition process. In the former process, dopants such as boron, aluminum, antimony, phosphorous, or arsenic may be ion-implanted into the substrate to form the source region 502 and drain region 504. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source region 502 and drain region 504. In some embodiments, the source region 502 and drain region 504 may be fabricated using a silicon alloy such as silicon germanium or silicon carbide. In some embodiments, the epitaxially deposited silicon alloy may be doped in-situ with dopants such as boron, arsenic, or phosphorous. In some embodiments, the source region 502 and drain region 504 may be formed using one or more alternate semiconductor materials such as germanium or a suitable group III-V compound. In some embodiments, one or more layers of metal and/or metal alloys may be used to form the source region 502 and drain region 504. In some embodiments, the gate contact 514 and source contact 516 of the transistor 500 are disposed in a first dielectric layer 520 disposed above the substrate 501. In some embodiments, terminal B is disposed in a second dielectric layer 522. In some embodiments, the second dielectric layer 522 is disposed on a third dielectric layer 524. In some embodiments, terminal A contact is disposed in the third dielectric layer 524.

Figure 6:
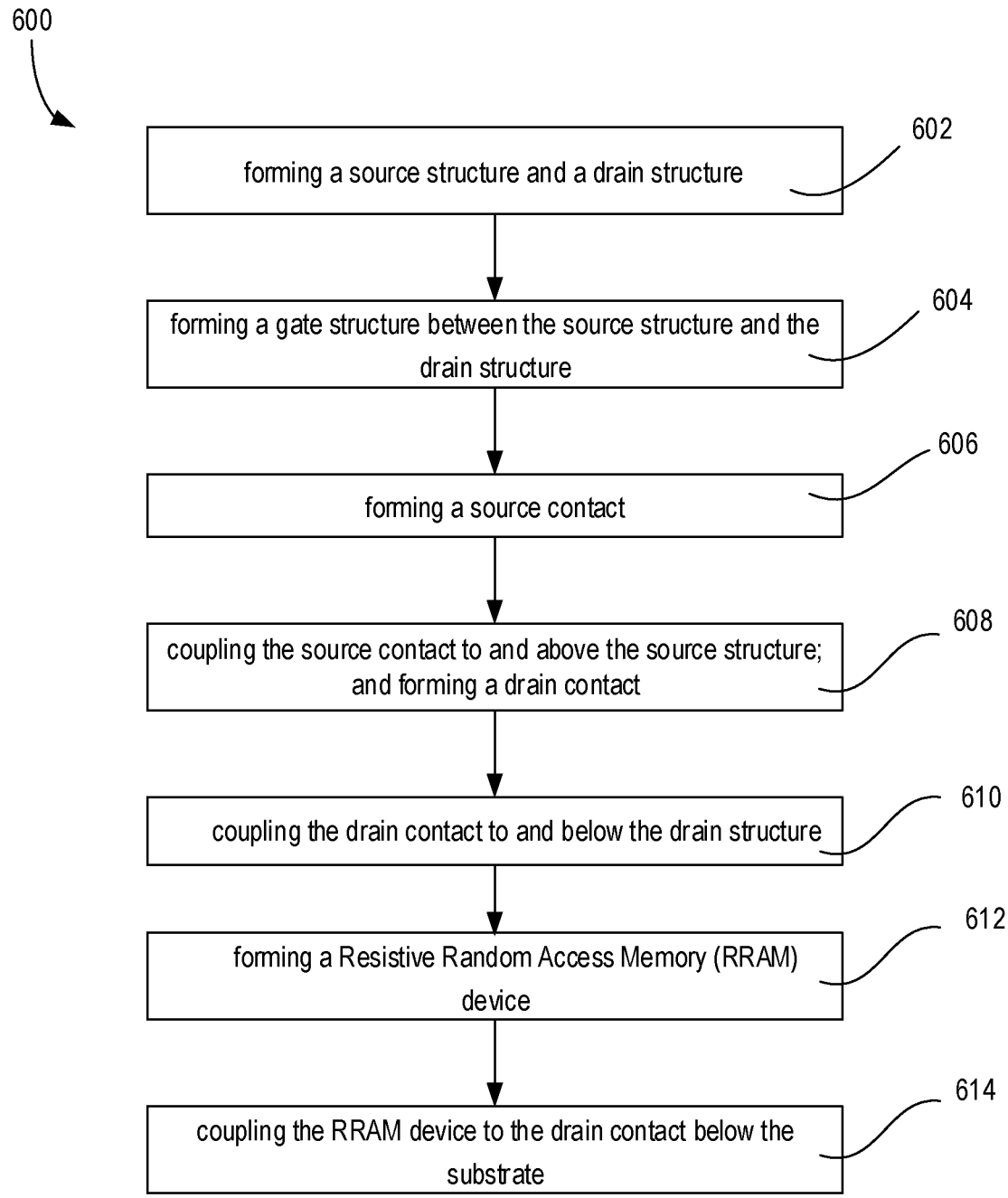
FIG. 6 illustrates a flow diagram of a method for forming a 1T-1R memory device (e.g., comprising any one of devices of FIGS. 2-5), in accordance with some embodiments.

FIG. 6 illustrates a flow diagram of a method for forming a 1T-1R memory device (e.g., comprising any one of devices of FIGS. 2-5), in accordance with some embodiments. Flowchart 600 begins with forming a transistor above a substrate, wherein forming the transistor begins at block (or operation) 602, forming a source structure and a drain structure. In some embodiments, the source structure and the drain structure include one or more of: silicon, germanium, or carbon.

Flowchart 600 continues at operation 604, forming a gate structure between the source structure and the drain structure. In some embodiments, the gate structure comprises a gate dielectric layer and a gate electrode layer. In some embodiments, the gate dielectric layer includes high-k dielectric material, and wherein the high-k dielectric material includes one or more of: hafnium, silicon, oxygen, titanium, tantalum, lanthanum, aluminum, zirconium, barium, strontium, yttrium, lead, scandium, niobium, or zinc. In some embodiments, the gate electrode layer comprises an N-type work-function metal. In some embodiments, the N-type work-function metal includes one or more of: hafnium, zirconium, titanium, tantalum, aluminum, or carbon.

Flowchart 600 continues at operation 606, forming a source contact. Flowchart 600 then continues at operation 608, coupling the source contact to and above the source structure. Flowchart 600 continues at operation 610, forming a drain contact. In some embodiments, the source contact and the drain contact include one or more of: Ti, N, Ta, W, C, Pt, Cr, Hf, Ir, Ru, Mo, In, O, Al, Zn, Cu, or Au. Flowchart 600 continues at operation 610, coupling the drain contact to below the drain structure. In some embodiments, the source contact is coupled to a source line, the RRAM is coupled to a bit-line, and the gate electrode is coupled to a word-line.

Flowchart 600 then continues at operation 612, forming a Resistive Random Access Memory (RRAM) device. Flowchart 600 ends at operation 614, coupling the RRAM device to the drain contact below the substrate.

Figure 7:
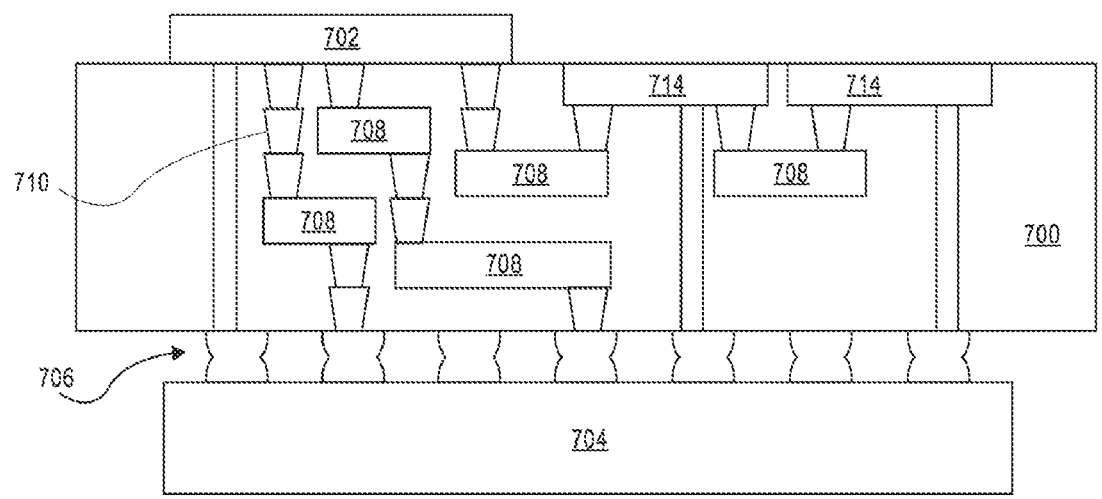
FIG. 7 illustrates an interposer, in accordance with some embodiments.

FIG. 7 illustrates an interposer that includes one or more embodiments of the disclosure. The integrated circuit (IC) structure 700 is an intervening structure used to bridge a first substrate 702 to a second substrate 704. The first substrate 702 may be, for instance, an integrated circuit die. The second substrate 704 may be, for instance, a memory module, a computer mother, or another integrated circuit die. The memory module may include one or more memory devices such as a 1T-1R memory device. Generally, the purpose of an integrated circuit (IC) structure 700 is to spread a connection to a wider pitch or to reroute a connection to a different connection. For example, an integrated circuit (IC) structure 700 may couple an integrated circuit die to a ball grid array (BGA) 706 that can subsequently be coupled to the second substrate 704. In some embodiments, the first and second substrates 702/704 are attached to opposing sides of the integrated circuit (IC) structure 700. In other embodiments, the first and second substrates 702/704 are attached to the same side of the integrated circuit (IC) structure 700. And in further embodiments, three or more substrates are interconnected by way of the integrated circuit (IC) structure 700.

The integrated circuit (IC) structure 700 may be formed of an epoxy resin, a fiberglass-reinforced epoxy resin, a ceramic material, or a polymer material such as polyimide. In further implementations, the integrated circuit (IC) structure 700 may be formed of alternate rigid or flexible materials that may include the same materials described above for use in a semiconductor substrate, such as silicon, germanium, and other group III-V and group IV materials.

The integrated circuit (IC) structure 700 may include metal interconnects 708 and via 710, including but not limited to through-silicon vias (TSVs) 710. The integrated circuit (IC) structure 700 may further include embedded devices 714, including both passive and active devices. Such devices include, but are not limited to, capacitors, decoupling capacitors, resistors, inductors, fuses, diodes, transformers, transistors, one or more 1T-1R memory devices, sensors, and electrostatic discharge (ESD) devices. More complex devices such as radio-frequency (RF) devices, power amplifiers, power management devices, antennas, arrays, sensors, and MEMS devices may also be formed on the integrated circuit (IC) structure 700. In accordance with embodiments of the present disclosure, apparatuses or processes disclosed herein may be used in the fabrication of integrated circuit (IC) structure 700.

Figure 8:
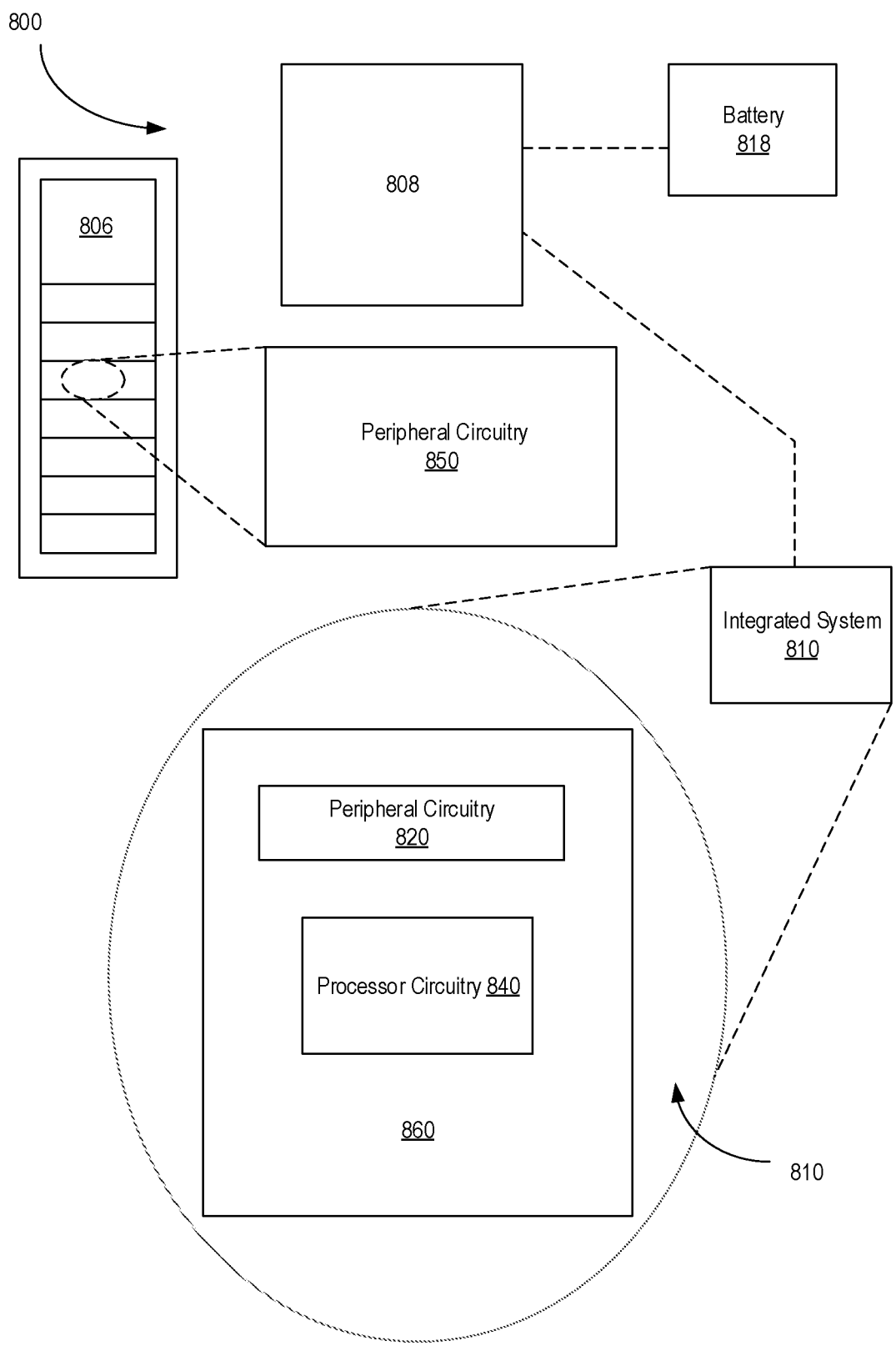
FIG. 8 illustrates a mobile computing platform and a data server machine including a 1T-1R memory cell, in accordance with some embodiments.

FIG. 8 illustrates a mobile computing platform 800 and a data server machine including at least one embedded or integrated 1T-1R memory device in accordance with some embodiments. In some embodiments, the server machine 806 may be any commercial server, for example including any number of high-performance computing platforms disposed within a rack and networked together for electronic data processing, which in the exemplary embodiment includes a circuitry 850. The mobile computing platform 808 may be any portable device configured for each of electronic data display, electronic data processing, wireless electronic data transmission, or the like, in accordance with some embodiments. For example, the mobile computing platform 808 may be any of a tablet, a smart phone, laptop computer, etc., and may include a display screen (e.g., a capacitive, inductive, resistive, or optical touchscreen), a chip-level or package-level integrated system 810, and a battery 818.

Whether disposed within the integrated system 810 illustrated in the expanded view (810), or as a stand-alone discrete or packaged multi-chip module within the server machine 806, the circuits include at least one 1T-1R memory device, for example in accordance with some embodiments described elsewhere herein. In some embodiments, disposed within the integrated system 810, a substrate 860 includes a circuitry 820 and processor circuitry 840 (e.g., a microprocessor, a multi-core microprocessor, graphics processor, or the like). In some embodiments, circuitry 820 includes 1T-1R memory devices, for example as described elsewhere herein. For monolithic embodiments, substrate 860 is a semiconductor chip. In some embodiments, processor circuitry 840, or a separate RFIC chip may be further coupled to an antenna (not shown) to implement any of a number of wireless standards or protocols, including but not limited to Wi-Fi (IEEE 1402.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 9:
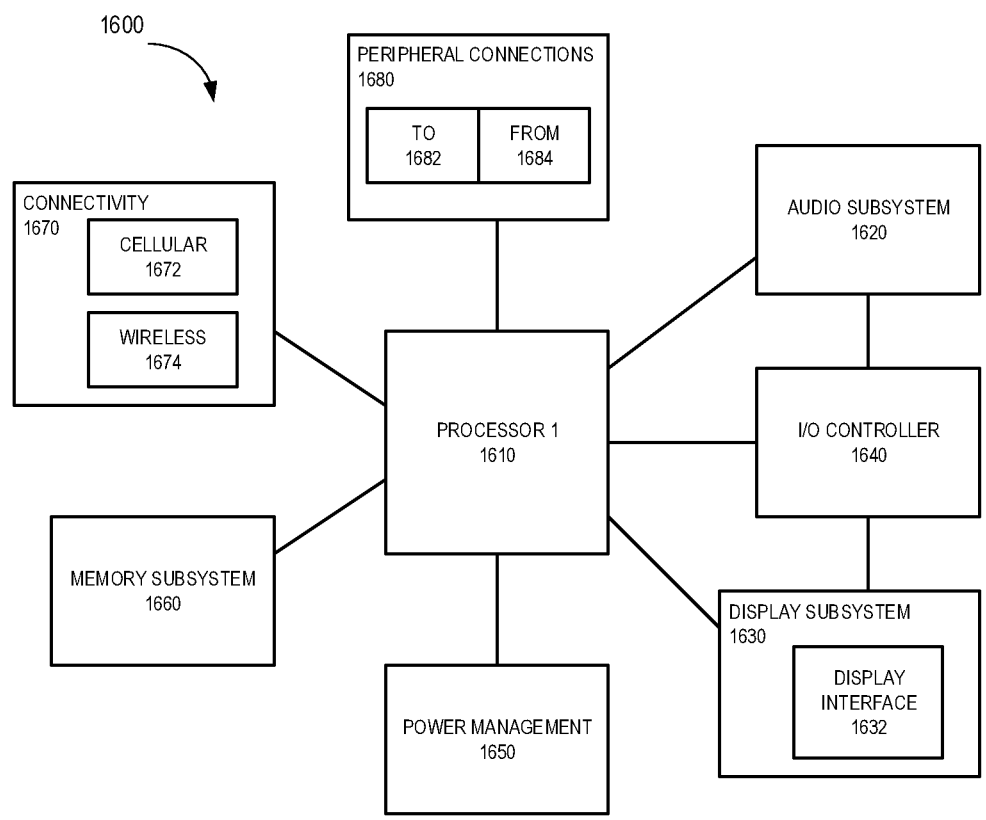
FIG. 9 illustrates a smart device or a computer system or a SoC (System-on Chip) 1600 including a 1T-1R memory cell, in accordance with some embodiments.

FIG. 9 illustrates a smart device or a computer system or a SoC (System-on-Chip) 1600 including a 1T-1R memory device, according to some embodiments.

FIG. 9 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600. In some embodiments, one or more blocks (even all blocks) may be powered using the super-capacitor. Any of the blocks of FIG. 9 may comprise a 1T-1R memory device as discussed with reference to various embodiments.

In some embodiments, computing device 1600 includes first processor 1610 and network interface within 1670 such as a wireless interface so that a system embodiment may be incorporated into a wireless device, for example, cell phone or personal digital assistant. Any of the various blocks of computing device 1600 can have or use the super capacitor of various embodiments.

In some embodiments, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In some embodiments, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In some embodiments, display interface 1632 includes logic separate from processor 1610 to perform at least some processing related to the display. In some embodiments, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600. In some embodiments, Memory subsystem 1660 includes the scheme of analog in-memory pattern matching with the use of resistive memory elements. In some embodiments, memory subsystem includes the 1T-1C memory using TFTs, according to some embodiments.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "some embodiments," "some embodiments," or "other embodiments" means that a particular feature, structure, or characteristic described in connection with the embodiments is included in at least some embodiments, but not necessarily all embodiments. The various appearances of "an embodiment," "some embodiments," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

In a first example, a memory cell comprises a transistor positioned in a backend of a die, the transistor comprising: a source structure and a drain structure; a gate structure between the source structure and the drain structure; a source contact coupled to and above the source structure and a drain contact coupled to and below the drain structure; and a Resistive Random Access Memory (RRAM) device coupled to the drain contact.

In a second example, further to the first example, the transistor comprises of a Thin Film Transistor (TFT).

In a third example, further to the first or second examples, the source structure and the drain structure include one or more of: silicon, germanium, or carbon.

In a fourth example, further to any of the first through third examples, the source structure and the drain structure are doped with dopants, wherein the dopants include one or more of: boron, arsenic, or phosphorous.

In a fifth example, further to any of the first through fourth examples, the gate structure comprises a gate dielectric layer and a gate electrode layer.

In a sixth example, further to any of the first through fifth elements, the gate dielectric layer includes high-k dielectric material, wherein the high-k dielectric material includes one or more of: hafnium, silicon, oxygen, titanium, tantalum, lanthanum, aluminum, zirconium, barium, strontium, yttrium, lead, scandium, niobium, or zinc.

In a seventh example, further to any of the first through sixth examples, the gate electrode layer comprises an N-type work-function metal.

In an eighth example, further to any of the first through seventh examples, the N-type work-function metal includes one or more of: hafnium, zirconium, titanium, tantalum, aluminum, or carbon.

In a ninth example, further to any of the first through eighth examples, the source contact and the drain contact include one or more of: Ti, N, Ta, W, C, Pt, Cr, Hf, Ir, Ru, Mo, In, O, Al, Zn, Cu, or Au.

In a tenth example, further to any of the first through ninth examples, the source contact is coupled to a source line, the RRAM is coupled to a bit-line, and the gate electrode is coupled to a word-line.

In an eleventh example, a system on chip (SOC) comprises a processor; a memory coupled to the processor, the memory comprising: a transistor positioned in a backend of a die, the transistor comprising: a source structure and a drain structure; a gate structure between the source structure and the drain structure; a source contact coupled to and above the source structure and a drain contact coupled to and below the drain structure; and a Resistive Random Access Memory (RRAM) device coupled to the drain contact; a wireless interface to allow the processor to communicate with another device.

In a twelfth example, further to the eleventh example, the transistor comprises a Thin Film Transistor (TFT).

In a thirteenth example, further to the eleventh or twelfth examples, the source structure and the drain structure include one or more of: silicon, germanium, or carbon.

In a fourteenth example, further to any of the eleventh through thirteenth examples, the source structure and the drain structure are doped with dopants, wherein the dopants include one or more of: boron, arsenic, or phosphorous.

In a fifteenth example, further to any of the eleventh through fourteenth examples, the gate structure comprises a gate dielectric layer and a gate electrode layer.

In a sixteenth example, further to any of the eleventh through fifteenth examples, the gate dielectric layer includes high-k dielectric material, wherein the high-k dielectric material includes one or more of: hafnium, silicon, oxygen, titanium, tantalum, lanthanum, aluminum, zirconium, barium, strontium, yttrium, lead, scandium, niobium, or zinc.

In a seventeenth example, further to any of the eleventh through sixteenth examples, the gate electrode layer comprises an N-type work-function metal.

In an eighteenth example, further to any of the eleventh through seventeenth examples, the N-type work-function metal includes one or more of: hafnium, zirconium, titanium, tantalum, aluminum, or carbon.

In a nineteenth example, further to any of the eleventh through eightteenth examples, the source contact and the drain contact include one or more of: Ti, N, Ta, W, C, Pt, Cr, Hf, Ir, Ru, Mo, In, O, Al, Zn, Cu, or Au.

In a twentieth example, further to any of the eleventh through nineteenth examples, the source contact is coupled to a source line, the RRAM is coupled to a bit-line, and the gate electrode is coupled to a word-line.

In a twenty-first example, a method of forming a 1T-1R memory cell comprises forming a transistor above a substrate, forming the transistor comprising: forming a source structure and a drain structure; forming a gate structure between the source structure and the drain structure; forming a source contact coupled to and above the source structure and forming a drain contact coupled to and below the drain structure; and forming a Resistive Random Access Memory (RRAM) device coupled to the drain contact below the substrate.

In a twenty-second example, further to the twenty-first example, the transistor comprises of a Thin Film Transistor (TFT).

In a twenty-third example, further to the twenty-first or twenty-second examples, the source structure material and the drain structure material include one or more of: silicon, germanium, or carbon.

In a twenty-fourth example, further to any of the twenty-first through twenty-third examples, the source structure material and the drain structure material are doped with dopants, wherein the dopants include one or more of: boron, arsenic, or phosphorous.

In a twenty-fifth example, further to any of the twenty-first through twenty-fourth examples, the gate structure comprises of a gate dielectric layer and a gate electrode layer.

In a twenty-sixth example, further to any of the twenty-first through twenty-fifth examples, the gate dielectric layer includes high-k dielectric material, wherein the high-k dielectric material includes one or more of: hafnium, silicon, oxygen, titanium, tantalum, lanthanum, aluminum, zirconium, barium, strontium, yttrium, lead, scandium, niobium, and zinc.

In a twenty-seventh example, further to any of the twenty-first through twenty-sixth examples, the gate electrode layer comprises an N-type work-function metal.

In a twenty-eighth example, further to any of the twenty-first through twenty-seventh examples, the N-type work-function metal includes one or more of: hafnium, zirconium, titanium, tantalum, aluminum, or carbon.

In a twenty-ninth example, further to any of the twenty-first through twenty-eighth examples, the source contact and the drain contact include one or more of: Ti, N, Ta, W, C, Pt, Cr, Hf, Ir, Ru, Mo, In, O, Al, Zn, Cu, or Au.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. A memory device, comprising:
   a transistor positioned in a backend of a die, the transistor comprising:
   a gate structure between a source structure and a drain structure, wherein the source and drain structures each comprise a top surface and a bottom surface opposite the top surface, the top surfaces of the source and drain structures being substantially coplanar and the bottom surfaces of the source and drain structures being substantially coplanar;
   a source contact on the top surface of the source structure and extending above the top surface of the source structure; and
   a drain contact on the bottom surface of the drain structure and extending below the bottom surface of the drain structure; and
   a Resistive Random Access Memory (RRAM) device coupled to the drain contact and below the drain contact.

2. The memory device of claim 1, wherein the transistor comprises of a Thin Film Transistor (TFT).

3. The memory device of claim 2, wherein the TFT comprises a polycrystalline channel material.

4. The memory device of claim 1, wherein the RRAM device is positioned in the backend of the die, the memory device further comprising:
   a device layer comprising a crystalline semiconductor, wherein the RRAM device is between the device layer and the transistor.

5. The memory device of claim 4, wherein the thin film transistor comprises a polycrystalline material and the crystalline semiconductor comprises monocrystalline silicon.

6. The memory device of claim 4, wherein the device layer comprises memory circuitry coupled to the transistor and the RRAM device.

7. The memory device of claim 4, wherein the memory device comprises a multilayer device including the device layer, a thin film transistor (TFT) layer comprising the transistor, and a RRAM device layer between the device layer and the TFT layer.

8. The memory device of claim 1, wherein the gate structure is partially or completely above the top surfaces of the source and drain structure.

9. The memory device of claim 8, wherein the gate structure comprises a gate dielectric layer and a gate electrode layer over the gate dielectric layer.

10. The memory device of claim 1, wherein the source contact is coupled to a source line above the source contact, the RRAM device is coupled to a bit-line below the RRAM device, and the gate electrode is coupled to a word-line above the gate electrode.

11. A system on chip (SOC) comprising:
    a processor;
    a memory coupled to the processor, the memory comprising:
    a transistor positioned in a backend of a die, the transistor comprising:
    a gate structure between a source structure and a drain structure, wherein the source and drain structures each comprise a top surface and a bottom surface opposite the top surface, the top surfaces of the source and drain structures being substantially coplanar and the bottom surfaces of the source and drain structures being substantially coplanar;
    a source contact on the top surface of the source structure and extending above the top surface of the source structure; and
    a drain contact on the bottom surface of the drain structure and extending below the bottom surface of the drain structure; and
    a Resistive Random Access Memory (RRAM) device coupled to the drain contact and below the drain contact; and
    a wireless interface to allow the processor to communicate with another device.

12. The system of claim 11, wherein the transistor comprises a Thin Film Transistor (TFT).

13. The system of claim 12, wherein the TFT comprises a polycrystalline channel material.

14. The system of claim 11, wherein the RRAM device is positioned in the backend of the die, the memory further comprising:
    a device layer comprising a crystalline semiconductor, wherein the RRAM device is between the device layer and the transistor.

15. The system of claim 14, wherein the thin film transistor comprises a polycrystalline material and the crystalline semiconductor comprises monocrystalline silicon.

16. The system of claim 14, wherein the device layer comprises memory circuitry coupled to the transistor and the RRAM device.

17. The system of claim 14, wherein the memory comprises a multilayer device including the device layer, a thin film transistor (TFT) layer comprising the transistor, and a RRAM device layer between the device layer and the TFT layer.

18. The system of claim 11, wherein the gate structure is partially or completely above the top surfaces of the source and drain structure.

19. The system of claim 18, wherein the gate structure comprises a gate dielectric layer and a gate electrode layer over the gate dielectric layer.

20. The system of claim 15, wherein the source contact is coupled to a source line above the source contact, the RRAM device is coupled to a bit-line below the RRAM device, and the gate electrode is coupled to a word-line above the gate electrode.

21. A method of forming a 1T-1R memory cell, the method comprising:

forming a transistor above a substrate, wherein forming the transistor comprises:

forming a source structure and a drain structure, wherein the source and drain structures each comprise a top surface and a bottom surface opposite the top surface, the top surfaces of the source and drain structures being substantially coplanar and the bottom surfaces of the source and drain structures being substantially coplanar;

forming a gate structure between the source structure and the drain structure;

forming a source contact on the top surface of the source structure and extending above the top surface of the source structure;

forming a drain contact on the bottom surface of the drain structure and extending below the bottom surface of the drain structure; and forming a Resistive Random Access Memory (RRAM) device coupled to the drain contact and below the drain contact.

22. The memory cell of claim 21, wherein the transistor comprises a Thin Film Transistor (TFT).

* * * * *